United States Patent
Reinmuth

(10) Patent No.: US 8,850,891 B2
(45) Date of Patent: Oct. 7, 2014

(54) MICROMECHANICAL COMPONENT AND MANUFACTURING METHOD FOR A MICROMECHANICAL COMPONENT

(75) Inventor: Jochen Reinmuth, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 189 days.

(21) Appl. No.: 13/288,750

(22) Filed: Nov. 3, 2011

(65) Prior Publication Data
US 2012/0167681 A1 Jul. 5, 2012

(30) Foreign Application Priority Data
Jan. 5, 2011 (DE) .......................... 10 2011 011 160

(51) Int. Cl.
*G01P 15/125* (2006.01)
*B81B 3/00* (2006.01)
*G01P 15/18* (2013.01)
*G01P 15/08* (2006.01)

(52) U.S. Cl.
CPC ............ *G01P 15/125* (2013.01); *B81B 3/0078* (2013.01); *B81B 2201/0235* (2013.01); *G01P 2015/0831* (2013.01); *G01P 15/0802* (2013.01); *G01P 15/18* (2013.01)
USPC ..................................................... 73/514.32

(58) Field of Classification Search
USPC .............................. 73/514.32, 514.38, 514.36
See application file for complete search history.

(56) References Cited

U.S. PATENT DOCUMENTS

| 4,736,629 | A * | 4/1988 | Cole | 73/514.32 |
| 6,000,287 | A * | 12/1999 | Menzel | 73/514.32 |
| 6,035,714 | A * | 3/2000 | Yazdi et al. | 73/514.32 |
| 6,230,566 | B1 * | 5/2001 | Lee et al. | 73/514.32 |
| 6,792,806 | B2 * | 9/2004 | Ishikawa et al. | 73/514.34 |
| 7,398,684 | B2 * | 7/2008 | Kimino | 73/514.38 |
| 7,426,863 | B2 * | 9/2008 | Kuisma | 73/514.32 |
| 8,171,793 | B2 * | 5/2012 | Foster | 73/514.32 |
| 8,549,921 | B2 * | 10/2013 | Schwarzelbach et al. | 73/514.32 |
| 2006/0185433 | A1 * | 8/2006 | Leonardson et al. | 73/514.32 |

FOREIGN PATENT DOCUMENTS

DE    102006051329    5/2008

* cited by examiner

Primary Examiner — Helen Kwok
(74) Attorney, Agent, or Firm — Kenyon & Kenyon LLP

(57) ABSTRACT

A micromechanical component having a fixing point and a seismic weight, which is connected to the fixing point by at least one spring and is made at least partially out of a first material, the first material being a semiconductor material, the seismic weight being additionally made out of at least one second material, and the second material having a higher density than the first material. In addition, a manufacturing method for a micromechanical component is provided, having the steps of forming a seismic weight at least partially out of a first material, the first material being a semiconductor material, connecting the seismic weight to a fixing point of the micromechanical component, using at least one spring, and forming the seismic weight from the first material and at least one second material, which has a higher density than the first material.

8 Claims, 7 Drawing Sheets

MICROMECHANICAL COMPONENT AND MANUFACTURING METHOD FOR A MICROMECHANICAL COMPONENT

CROSS-REFERENCE

The present application claims the benefit under 35 U.S.C. §119 of German Patent Application No. DE 102011011160.3, filed on Jan. 5, 2011, which is expressly incorporated herein by reference in its entirety.

FIELD OF THE INVENTION

The present invention relates to a micromechanical component. In addition, the present invention relates to a manufacturing method for a micromechanical component.

BACKGROUND INFORMATION

German Patent Application No. DE 10 2006 051 329 A1 describes a Z-axis acceleration sensor, which has a seismic weight that is in the form of a planar rocker arm and may be deflected out of a wafer plane. The seismic weight patterned completely out of a semiconductor layer deposited beforehand onto the substrate is connected to a residual substrate by a structure functioning as a torsion spring, and has a shape that ensures variable moments of inertia of the rocker-arm sides, due to an asymmetry of the mass distribution with respect to an axis of rotation of the rocker arm. Two counter-electrodes are situated on the substrate, each forming a capacitor with an adjacent surface of a rocker-arm side. If the Z-axis acceleration sensor experiences an acceleration in a direction perpendicular to the substrate, then the seismic weight, is tilted about the axis of rotation, out of the substrate plane, which produces a change in the capacitances of the two capacitors corresponding to the acceleration.

SUMMARY

In accordance with the present invention, by forming the seismic weight from a first material that is a semiconductor material, and from a second material that has a higher density than the first material, the easily implementable methods of semiconductor technology may be used in the production of the micromechanical component. At the same time, the average density many be increased specially for the seismic weight. In this manner, the mass of the seismic weight is increasable while retaining the size. In particular, a desired asymmetry in the mass distribution of the seismic weight is easily implementable using this technology.

By increasing the average density of the seismic weight, using the second material having a higher density, the sensitivity of a micromechanical component acting as a sensor may be increased without reducing the spring stiffness of the at least one spring. Consequently, it is not necessary to provide the micromechanical component with at least one especially narrow spring. Instead, the dimensions of the at least one spring may be selected so that a readily definable shape of the at least one spring is easily and reliably producible. In the manufacturing process, the stiffness of the at least one spring may be specially adjusted to a desired value in a simple manner. In comparison with a very narrow spring, such a spring has the additional advantage that it does not show much predeflection, which should be taken into account in the evaluation of a sensor signal. Therefore, a sensor signal supplied by the micromechanical component functioning as a sensor may be easily evaluated and ensures good performance. In addition, in comparison with a more flexible spring, a spring having a greater spring stiffness has the advantage of an increased restoring force, which means that the risk of impact or sticking of the seismic weight with or to a housing component of the micromechanical component is reliably prevented. Consequently, a failure of the micromechanical component functioning as a sensor, due to sticking of the seismic weight to the housing component, does not have to be feared.

It should be emphasized that the seismic weight may only include the first material as a residual material (trace element). For example, the concentration of the first material in the seismic weight may be attributed to incomplete removal of the first material in a substitution reaction.

The example embodiment of the present invention may allow, in particular, the manufacture of an acceleration sensor by which small accelerations are also detectable and/or measurable. By increasing the mass of the seismic weight while maintaining the size of the seismic weight, the responsivity/sensitivity of such a sensor is advantageously increased. In addition, it is ensured that the space requirement of such a sensor remains low, since the size of the seismic weight is retained.

Using the example embodiment of the present invention, comparatively small, low-g acceleration sensors having high restoring forces may be produced, which have a lower degree of offset scatter and, consequently, a better performance. In particular, such sensors have a lower tendency to stick. However, the micromechanical component according to the present invention is not limited to an embodiment as an acceleration sensor, in particular, for detecting/measuring an acceleration perpendicular to a neutral position of the seismic weight. Instead, the micromechanical component having the seismic weight, whose weight is increased while maintaining its size, may also be used for other purposes.

The example manufacturing method of the present invention may allow an advantageous micromechanical component having a heavy seismic weight to be manufactured at a comparatively low cost while maintaining the sensor size. In an advantageous embodiment, a partial weight of the seismic weight, the at least one spring and at least a part of the fixing point may be produced from a semiconductor layer, in particular, from a silicon layer. A semiconductor material such as silicon may be processed highly effectively and has very good mechanical properties. In addition, it is suitable for producing defined shapes having small dimensions. Therefore, micromechanical components having very small dimensions and a high sensitivity/responsivity may also be manufactured inexpensively for low accelerations, using the easily implementable semiconductor technologies. In addition, the example manufacturing method according to the present invention is compatible with semiconductor technologies, in particular, with conventional manufacturing processes for acceleration sensors. Consequently, standard systems for CMOS manufacturing and/or for MEMS manufacturing may be used for implementing the manufacturing method.

The second material may include at least one metal. For example, the second material may include hafnium, tantalum, tungsten, rhenium, osmium, iridium, platinum, gold and/or copper. As described below in more detail, the metals mentioned here may be integrated into the seismic weight in a simple manner.

The at least one spring is preferably made of the first material (semiconductor material) and formed in one piece with a part of the seismic weight made of the first material and/or with at least a part of the fixing point made of the first material. By patterning the at least one spring out of a layer of the first material, in which case the part of the seismic weight made of the first material and/or at least a part of the fixing point made of the first material is simultaneously formed, these components of the micromechanical component may be produced/preformed in small size in a simple manner and simultaneously joined to each other.

In an advantageous embodiment, the seismic weight includes at least a first partial weight made out of the first material and a second partial weight at least partially made out of the second material, the second partial weight being connected to the first partial weight by at least one spring structure. In this manner, stress decoupling for preventing transmission of a mechanical stress is easily and reliably implementable due to the different parameters of the first material and the second material.

The advantages described in the paragraphs above are also provided in a corresponding manufacturing method.

The forming of the seismic weight from at least the first material and the second material preferably includes the steps: patterning a starting structure out of a layer of the first material and coating at least an upper surface of the starting structure with the second material and/or carrying out a substitution reaction to replace at least an outer layer of the starting structure with the second material. Such a manufacturing method ensures, in particular, that the second material is introduced into the seismic weight in an easily implementable manner.

In addition, a CVD method (chemical vapor deposition) and/or an electroplating method may be carried out for coating the at least one upper surface of the starting structure. Such methods may be implemented cost-effectively with high reliability.

In particular, $WF_6$ and hydrogen may be deposited for coating the at least one upper surface of the starting structure. Due to its density, which is 8.3 times higher than the density of silicon, the use of tungsten is particularly advantageous. This advantage is also ensured if $WF_6$ is deposited for carrying out the substitution reaction.

BRIEF DESCRIPTION OF THE DRAWINGS

Additional features and advantages of the present invention are explained below, with reference to the figures.

FIGS. 2a and 2b show schematic representations of a first specific embodiment of the micromechanical component, FIG. 2a representing a top view of the micromechanical component, and FIG. 2b representing a perpendicular cross section of the micromechanical component along a line I-I' of FIG. 2a.

FIGS. 5a and 5b show schematic representations of a second specific embodiment of the micromechanical component, FIG. 5a representing a top view of the micromechanical component, and FIG. 5b representing a perpendicular cross section of the micromechanical component along a line I-I' of FIG. 5a.

DETAILED DESCRIPTION OF EXAMPLE EMBODIMENTS

In the following, the technology according to the present invention is described with reference to micromechanical components and manufacturing methods for micromechanical components, the micromechanical components being designed as acceleration sensors for detecting and/or establishing (measuring) an acceleration and/or an acceleration component in a spatial direction perpendicular to the surface of the seismic weight of the micromechanical component, present in its (zero-acceleration) starting position. However, it is pointed out that the technology according to the present invention is not limited to such micromechanical components and methods for their manufacture.

For example, using the technology according to the present invention, an acceleration sensor may also be manufactured/provided, by which an acceleration in two spatial directions (preferably oriented perpendicularly to one another), or two acceleration components, are detectable and/or determinable (measurable). Such an acceleration sensor may include, for example, a seismic weight formed symmetrically about a torsion axis, the seismic weight being connected to a fixing point, e.g., a substrate, by at least one spring. If the micromechanical component experiences an acceleration in at least one of the detectable spatial directions, then the seismic weight suspended at the at least one spring moves. The movement of the weight may be detected, using a change in capacitance between stator electrode fingers and actuator electrode fingers coupled to the seismic weight. At this point, since such micromechanical components usable as acceleration sensors are conventional, they are not discussed herein in further detail.

In addition to the examples of acceleration sensors described here, the technology according to the present invention is also applicable to other types of micromechanical components having a seismic weight, which is connected to a fixing point by at least one spring.

Figure 1A:
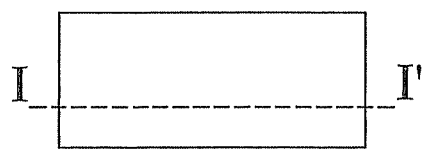
FIGS. 1Aa through 1Fa represent top views of a semiconductor substrate, and FIGS. 1Ab through 1Fb represent perpendicular cross-sections of the semiconductor substrate along a line I-I' of 1Aa through 1Fa.
Figure 1A:
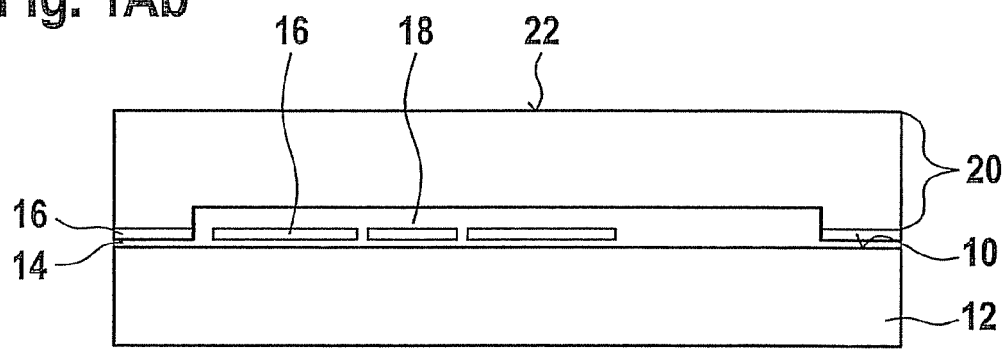

FIGS. 1Aa through 1Fa represent top views of a semiconductor substrate, and FIGS. 1Ab through 1Fb represent perpendicular cross-sections of the semiconductor substrate along a line I-I' of 1Aa through 1Fa.

In the schematically represented manufacturing method, an upper surface 10 of a substrate 12 is at least partially covered by an insulating layer 14. Substrate 12 may be a semiconductor substrate, such as a silicon substrate. However, substrate 12 may also include at least one further material, such as a metal. In addition, the ability to execute the method described below is not limited to the use of such a substrate 12 as a support for insulating layer 14. Instead, a stable plate may also be used as a support for insulating layer 14.

Insulating layer 14 may include silicon oxide as an insulating material 18, the silicon oxide being formed, for example, by thermal oxidation on upper surface 10. As an alternative, or in addition to that, a different insulating material may also be deposited onto upper surface 10. Insulating layer 14 is at least partially covered by a conductive layer 16. Conductive layer 16 may include/be, for example, a doped semiconductor layer and/or a metallic layer. Contact surfaces, conducting paths, electrodes and/or further components, which are integrated into a MEMS structure in further method steps, may be formed out of conductive layer 16. Conventional etching methods may be implemented for patterning the contact surfaces, conducting paths, electrodes and/or further components out of conductive layer 16.

In order to ensure increased mobility of the seismic weight produced later, partial regions of insulating layer 14 and/or of conductive layer 16 may optionally be covered by an (additional) insulating material 18. Insulating material 18 preferably has the same etching properties as the material of insulating layer 14. In particular, insulating material 18 may also be the material used for forming insulating layer 14, in particular, silicon oxide.

Subsequently, a layer 20 of a semiconductor material designated as a first material is formed on exposed surfaces of conductive layer 16 and/or of additional insulating material 18, which means that the manufactured layer structure having components 12 through 20 may be referred to as a SOI structure. FIGS. 1Aa and 1Ab show the layer construction having components 12 through 20.

Layer 20 preferably has a layer thickness, which is greater than the layer thickness of insulating layer 14 and/or the layer thickness of conductive layer 16. Layer 20 may be, e.g., a polycrystalline silicon layer. To deposit the layer 20 taking the form of a polycrystalline silicon layer, a polycrystalline silicon starting layer may be initially deposited, and further silicon may be subsequently deposited using epitaxial deposition.

Figure 1B:
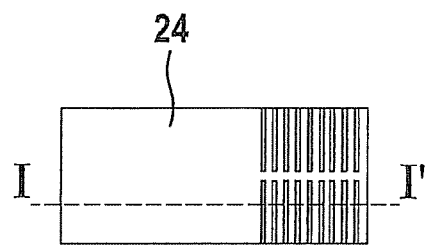
Figure 1B:
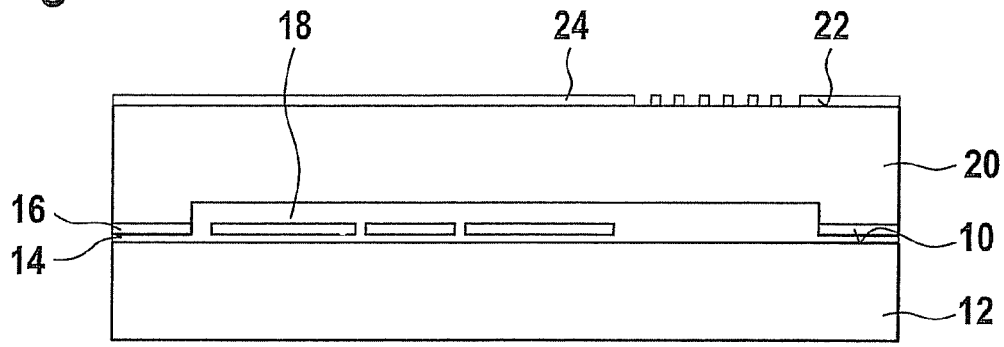

A patterned passivation layer 24 is then formed on an upper side 22 of layer 20 oriented away from substrate 12 (see FIGS. 1Ba and 1Bb). The material of passivation layer 24 is preferably selected to not undergo a reaction with a carrier gas of the subsequent, second material of the seismic weight, the carrier gas being used in a later method step. For example, an oxide layer is deposited and patterned on upper side 22 as a patterned passivation layer 24, in particular, when $WF_6$, which does not undergo a substitution reaction with this oxide, is used as a carrier gas in a later method step. A further advantage of an oxide layer as a patterned passivation layer 24 is its suitability as a mask during the first patterning of layer 20 carried out subsequently.

Figure 1C:
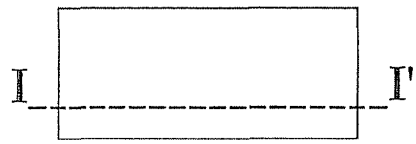
Figure 1C:
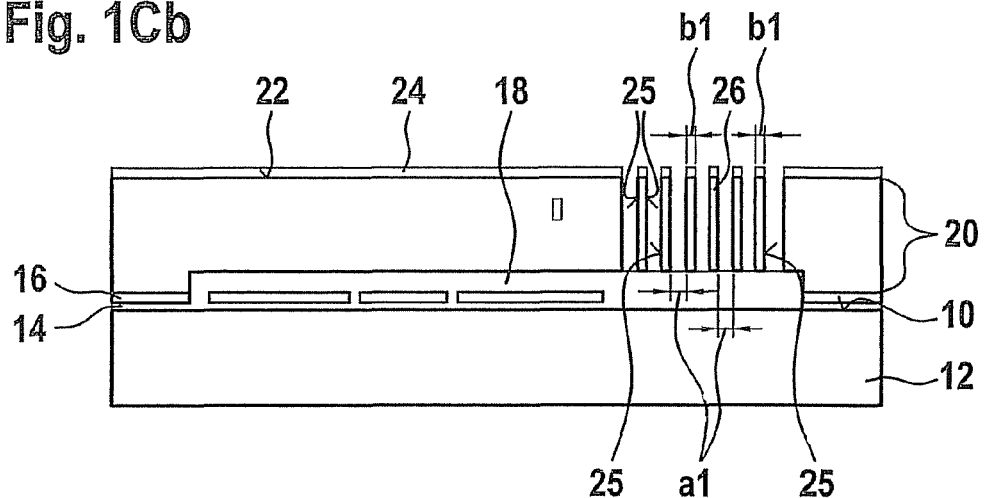

As represented in FIGS. 1Ca and 1Cb, layer 20 is etched after formation of patterned passivation layer 24. In this etching step, a starting structure. 26 of the subsequent seismic weight is patterned out of layer 20 of the semiconductor material. This etching step is associated with the advantage, that one obtains a larger total surface area out of at least one uncovered semiconductor surface 25 for implementing a deposition method and/or a substitution reaction. In particular, a trenching process executed as an etching process, in which at least one trench passing perpendicularly through layer 20 is formed, is advantageous due to the markedly increased, total surface area. A further increase in the available total surface area for a deposition method and/or for a substitution reaction is possible, using subsequent, anisotropic etching.

Using the etching step, e.g., very narrow and closely adjacent finger structures of starting structure 26 may be formed out of layer 20. The finger structures are preferably formed so that distances a1 between the fingers are smaller than finger widths b1. This is primarily advantageous in the case of a substitution reaction carried out later. In a substitution reaction for replacing silicon with tungsten, since more silicon is consumed than tungsten is deposited, such a stipulation of distances a1 and finger widths b1 may allow the increase in mass of the seismic weight formed later to be intensified, the increase in mass resulting from the substitution reaction.

After patterning out starting structure 26, a layer of second material 28, which has a higher density than the first material (semiconductor material) of layer 20, is formed at at least one uncovered semiconductor surface 25 of starting structure 26. For example, a substitution reaction is carried out to replace at least one outer layer (semiconductor surface 25) of starting structure 26 with second material 28 (see FIGS. 1Da and 1Db). This technique allows second material 28 to be integrated into a later-formed seismic weight within the framework of an easily implementable manufacturing process. In this context, it is particularly ensured that second material 28 is selectively situated at/on uncovered semiconductor surface 25 or in place of uncovered semiconductor surfaces 25 of starting structure 26, and therefore, only at desired surfaces. The regions of layer 20, into which a second material is not intended to be integrated, are preferably covered by passivation layer 24 during the substitution reaction or a corresponding deposition process for specifically depositing second material 28. One may also adapt this, such that upper side 22 is covered in such a manner by passivation layer 24 during the coating of the at least one upper surface of starting structure 26, and/or during the substitution reaction, that the substitution reaction occurs selectively at the at least one outer layer 25 exposed by the patterning-out of starting structure 26 and/or that the at least one upper surface of starting structure 26 formed during the patterning-out of starting structure 26 or during the substitution reaction is selectively coated.

In one advantageous specific embodiment, $WF_6$ is brought onto the uncovered semiconductor surfaces of layer 20 as a carrier gas, in order to carry out the substitution reaction. If layer 20 contains silicon, the following chemical reaction takes place when $WF_6$ is used as a carrier gas:

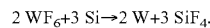

$$2\,WF_6 + 3\,Si \rightarrow 2\,W + 3\,SiF_4.$$

In this manner, the silicon of starting structure 26 may be at least partially replaced by tungsten as second material 28. With regard to its thermal properties and its chemical parameters, tungsten is a resistant material. The use of tungsten as a second material of the seismic weight subsequently formed is associated with the advantage, that the further manufacturing steps, such as gas-phase etching in HF for forming the seismic weight, are easily executable. In addition, no tungsten is deposited on an easily producible, oxide passivation layer 24.

However, the implementation of a substitution reaction for replacing at least an outer layer (semiconductor surfaces 25) of the starting structure with second material 28 is not limited to the use of tungsten as second material 28. Instead, a different metal, such as, in particular, hafnium, tantalum, rhenium, osmium, iridium and/or platinum may also be advantageously integrated into the subsequently formed seismic weight by way of a corresponding substitution reaction, using a suitable carrier material.

The substitution reaction takes place as long as contact between the first material (semiconductor material) of layer 20 and the carrier gas is ensured. In the process, residual semiconductor regions 29 are formed that are at least partially surrounded by second material 28. If the layer of tungsten taking the form of second material 28 reaches a thickness of, e.g., approximately 250 μm, then practically no silicon usable as a first material reaches from residual semiconductor regions 29, through the layer of tungsten, to the surface. In this case, the substitution reaction is finished. By producing thin (finger) structures of starting structure 26, which have a comparatively large, total surface area with regard to a volume of the (finger) structures, i.e., by suitably selecting distances a1 and finger widths b1, the manufacturing method may be adapted to this effect. During the substitution reaction, the thin structures (e.g., finger structures) formed in starting structure 26 may be almost completely converted into tungsten. At this juncture, it should be expressly pointed out that the seismic weight may be manufactured in such a manner, that the first material is only still present in it in the form of a trace element/residual element. For example, with a finger width b1 of under 500 μm, the finger structures may be formed to be so narrow, that the silicon is completely consumed. In this manner, an occurrence of a bimetallic effect in the subsequently formed seismic weight is preventable.

As an alternative to a substitution reaction, the forming of the seismic weight from at least the first material, which is a semiconductor material, and a second material 28 which has a higher density than the first material, may also include coating at least an upper surface of the starting structure (semiconductor surface 25) with the second material. For example, $WF_6$ and $H_2$ may be used as carrier gases for depositing tungsten. In this manner, tungsten may be selectively deposited without consuming a semiconductor material such as silicon, in which case the following reaction takes place:

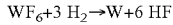

$$WF_6 + 3 H_2 \rightarrow W + 6 HF$$

The coating of the at least one upper surface of the starting structure (semiconductor surface 25) may also include a CVD method and/or an electroplating method. In particular, gold and copper may be reliably deposited in this manner. At this juncture, a more detailed description of the conventional method steps executed in this context is omitted.

In the same way, to supplement the substitution reaction, additional second material 28 may be deposited on at least one surface of second material 28. In an advantageous specific embodiment, after a substitution reaction with $WF_6$, amid more addition of $H_2$, the tungsten structures already present may be at least partially filled with tungsten. In particular, the tungsten structures may be completely filled up, which means that the following process steps are easily executable on the leveled tungsten surface. Using such a method, a particularly high, additional mass may be obtained.

After execution of the substitution process, passivation layer 24 may be removed.

Figure 1D:
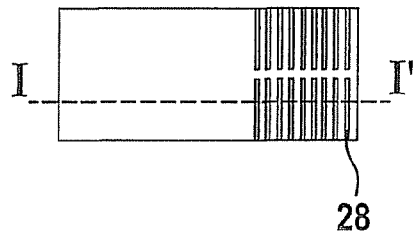
Figure 1D:
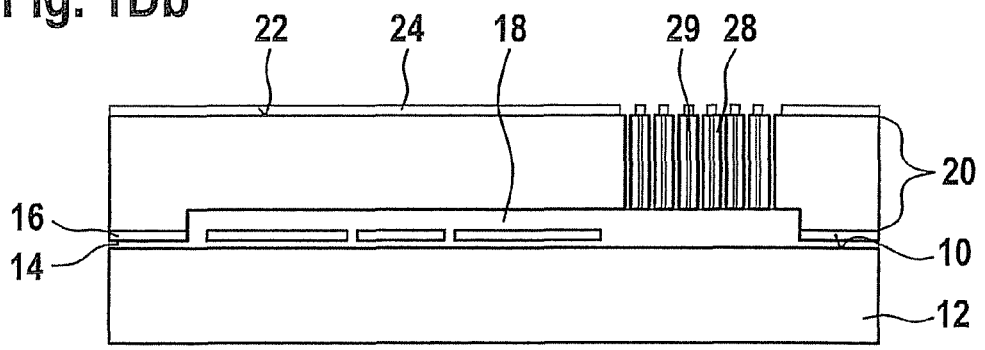
Figure 1E:
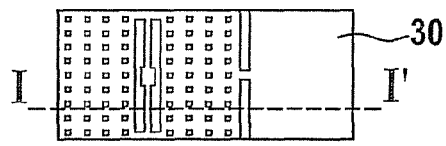
Figure 1E:
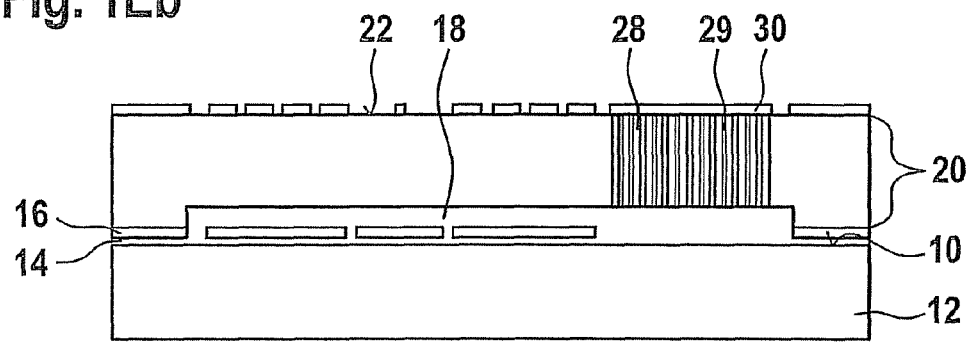

As shown in FIGS. 1Ea and 1Eb, upper side 22 is at least partially covered with a patterned etching mask 30 in a subsequent method step. The patterning of etching mask 30 defines at least the later shape of the seismic weight subsequently patterned out of the layer 20/the starting structure 26 having the applied/integrated second material 28. While patterning out the seismic weight, at least one spring and at least one fixing point of the subsequent micromechanical component may also preferably be formed, e.g., as at least part of a housing of the subsequent micromechanical component. In this case, the patterning of etching mask 30 may also allow the later shape of the at least one spring and the at least one fixing point to be defined. Consequently, the seismic weight may be connected to the at least one fixing point of the later micromechanical component in a simple manner, via the at least one spring.

Etching mask 30 may be, for example, a resist mask. However, the above-described advantages of a simple patterning-out of the seismic weight, preferably with at least one spring and at least one fixing point of the later micromechanical component, are not limited to an etching mask 30 taking the form of a resist mask.

Figure 1F:
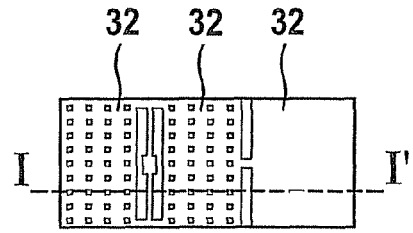
Figure 1F:
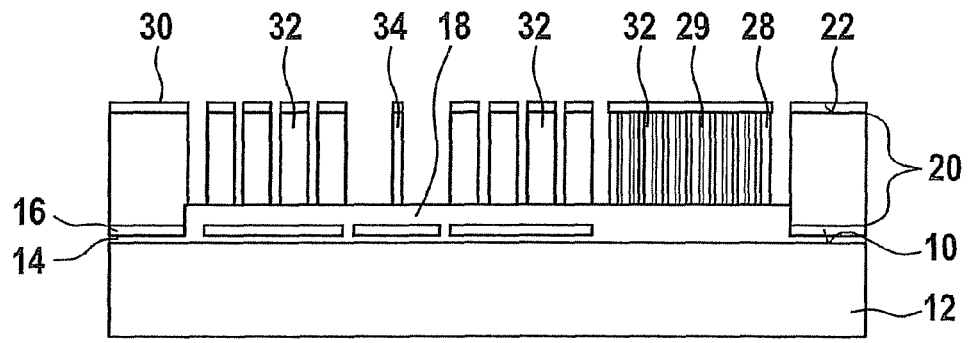

FIGS. 1Fa and 1Fb show the layer construction after an etching step, such as gas-phase etching in HF, for forming seismic weight 32 out of a first material, and out of a second material 28, which has a higher density than the first material. By a suitable choice of second material 28 and the etching material of the etching step, for example, tungsten 28 and gas-phase etching in HF, it is ensured that second material 28 is not etched in the etching step.

In the etching step, seismic weight 32 is preferably formed in such a manner, that seismic weight 32 is connected, via at least one spring, to at least one fixing point, e.g., to a rib 34 attached to substrate 12. Further advantages of a preferred refinement of seismic weight 32 will be discussed below in more detail.

Etching mask 30 may be subsequently removed. In the same manner, seismic weight 32 may be released by at least partially removing insulating material 18 and insulating layer 14. It is also possible to seal/close the seismic weight by placing a cap (not shown) on the outer edge of upper side 22. Since suitable method steps for removing etching mask 30 and insulating material 18, as well as for encapsulating, are conventional, they are not discussed here in further detail.

Figure 2A:
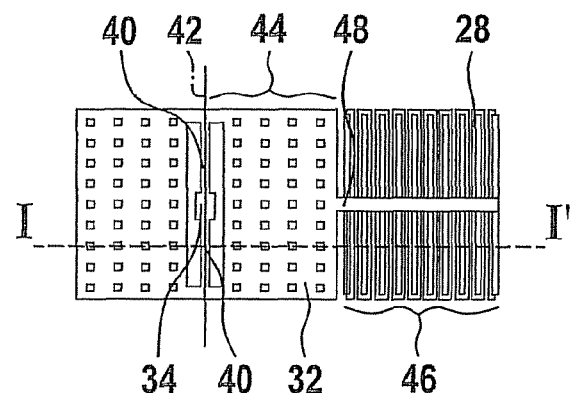
Figure 2B:
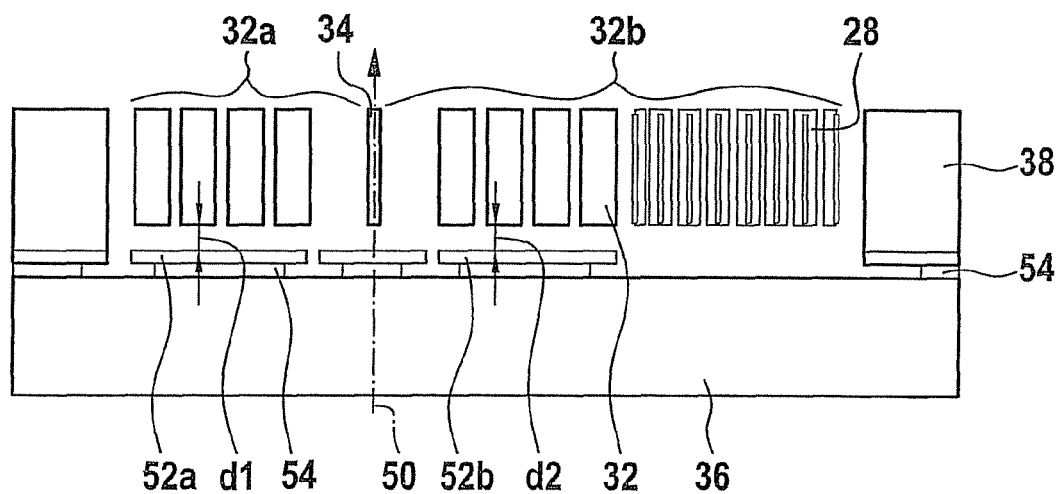

FIGS. 2a and 2b show schematic representations of a first specific embodiment of the micromechanical component, FIG. 2a representing a top view of the micromechanical component, and FIG. 2b representing a perpendicular cross section of the micromechanical component along a line I-I' of FIG. 2a.

The micromechanical component schematically represented by FIGS. 2a and 2b may be manufactured, for example, using the manufacturing method described in light of FIGS. 1A through 1F. However, the producibility of the micromechanical component is not limited to exact execution of the above-described manufacturing method. For example, seismic weight 32 may already be patterned out of a semiconductor material prior to introducing second material 28. Subsequent to the patterning-out, the at least one trench formed may be at least partially filled again with an oxide of an oxide layer, which is used as a passivation layer in the case of subsequent introduction of the second material into the seismic weight.

The micromechanical component has a housing, of which, however, only a lower side is shown as a housing component for the sake of more clarity. Such a housing component includes, for example, a base plate 36 obtained from the substrate, a rib 34 securely mounted to base plate 36 as a fixing point, and a frame part 38. However, the micromechanical component is not limited to such a construction of the housing component. In particular, the micromechanical component is not limited to a housing component as a part of a closed housing. Instead, seismic weight 32 of the micromechanical component may also be at least partially surrounded by a housing component formed merely as a frame.

Seismic weight 32 is connected, via at least one spring 40, to the rib 34 used as a fixing point. In this manner, seismic weight 32 is movably connected to rib 34. For example, seismic weight 32 may be pivoted about an axis of rotation 42, two springs 40 on both sides of rib 34 being able to extend along axis of rotation 42, to the seismic weight that surrounds rib 34 and the two springs in the manner of a frame. However, the micromechanical component is not limited to such a suspension.

Seismic weight 32 is made of a semiconductor material as a first material of seismic weight 32, and of at least one further, second material 28; second material 28 having a higher density than the first material. The second material may include, for example, at least one metal. In particular, the second material may include hafnium, tantalum, tungsten, rhenium, osmium, iridium, platinum, gold and/or copper. The at least one spring 40 may also be formed from the semiconductor material of seismic weight 32. The at least one spring 40 is preferably integrally connected to a part of the seismic weight made of the semiconductor material. In the same way, the least one spring may be integrally connected to a part of the fixing point made of the semiconductor material, e.g., to rib 34. This ensures a simple connection of seismic weight 32 to rib 34 via the at least one spring 40.

Seismic weight 32 preferably has an inner side oriented towards the base plate 36 obtained from the substrate, and an outer side oriented away from base plate 36; seismic weight 32 including finger structures, which are situated between the inner side and the outer side and contain at least the second material. The longitudinal center axes of the finger structures are preferably oriented parallelly to the inner side and/or to the outer side. In particular, the heights of the finger structures may extend from the inner side to the outer side. The finger structures may be formed from the second material in such a manner, that the first material is present in them as, at the most, a residual element. At the same time, a partial outer surface of the outer side may be made of the first material. In comparison with merely coating a structure formed from the first material with the second material, such an advantageous embodiment of seismic weight 32 is associated with the advantage of improved stress decoupling. In particular, the advantageous embodiment of seismic weight 32 is implementable in a simple and cost-effective manner, using the above-described manufacturing method.

In the following, a particularly advantageous, specific embodiment of seismic weight 32 is described. However, it should be pointed out that the construction of seismic weight 32 is not limited to the exemplary embodiment described below in further detail.

In the advantageous specific embodiment, seismic weight 32 includes a first half 32a having a first weight, which is situated on a first side of axis of rotation 42, as well as a second half 32b, which is situated on a second side of axis of rotation 42 and has a second weight. Second half 32b has a first subunit 44, which is formed to be specularly symmetric to first half 32a with respect to axis of rotation 42. First subunit 44 may also have the same mass as first half 32a. In addition, second half 32b has a second subunit 46, which is connected to first subunit 44 by at least one spring structure 48. Accordingly, second subunit 46 defines an additional weight of second half 32b in comparison with first half 32a of seismic weight 32.

First subunit 44 and/or first half 32a are preferably formed (completely) from the first material, a semiconductor material such as silicon. In contrast, second subunit 46 is formed at least partially from the second material having a higher density than the first material. By forming second subunit 46 at least partially out of the second material having the higher density, the additional mass of second half 32b may be markedly increased while keeping the size constant. Consequently, seismic weight 32 may be formed in a simple manner as an asymmetric rocker arm having an advantageously significant asymmetry with regard to its mass distribution.

One may also adapt seismic weight 32 in such a manner, that a first partial weight of seismic weight 34 made out of the semiconductor material, including first half 32a and first subunit 44, and a second partial weight at least partially made of second material 28, including second subunit 46, are connected to each other by at least one spring structure 48. Spring structure 48 may be anchored, for example, to a side of first subunit 44 oriented away from axis of rotation 42. For example, spring structure 48 may take the form of a narrow rib.

Forming spring structure 48 between first subunit 44 and second subunit 46 is associated with the advantage that the two subunits 44 and 46 are connectable to each other in a stress-decoupled manner. By combining a semiconductor material and second material 28, e.g., by combining silicon with tungsten, and due to the different thermal coefficients of expansion of these materials, strong bimetallic effects may occur in the transition regions between the two materials. If the second partial weight (second subunit 46) is only connected to the first partial weight (first half 32a and first subunit 44) by spring structure 48, then a decoupling of (mechanical) stress from the second partial weight into the first partial weight, and therefore deformation of the first partial weight, in particular, first subunit 44, may be prevented.

It is also possible to connect second subunit 46 to first subunit 44 at a plurality of locations, via at least two slightly elastic ribs. The higher number of ribs of spring structure 48 ensures advantageous stress decoupling. At least one decoupling structure, e.g., a slightly elastic rib, may also be formed inside of second subunit 46, in order to improve the stress decoupling and/or limit deformations inside of second subunit 46. However, in order to provide better clarity, such a decoupling structure is not shown in FIGS. 2a and 2b.

In the following, the method of functioning of the micromechanical component is briefly explained.

If the micromechanical component experiences an acceleration in an axis 50 oriented perpendicular to base plate 36 and/or to seismic weight 32 in its zero-acceleration starting position, then the additional weight of second half 32b, i.e., the mass of second subunit 46, causes seismic weight 32 to tilt about axis of rotation 42. Using a sensor device, this tilting movement of the seismic weight out of its starting position, about axis of rotation 42, may be detected or ascertained in a simple manner.

In an easily implementable, specific embodiment of the sensor device, counter-electrodes 52a and 52b are mounted to base plate 36, the counter-electrodes being electrically insulated from base plate 36 by an insulating material 54. A first counter-electrode 52a may be situated at base plate 36, adjacent to first half 32a. In a corresponding manner, a second counter-electrode 52b may be attached to base plate 36, adjacent to first subunit 44 of second half 32b. In this case, counter-electrodes 52a and 52b form a capacitor with their respective, adjacent component 32a or 44 of seismic weight 32. If seismic weight 32 tilts about axis of rotation 42, a first distance d1 between first half 32a and first counter-electrode 52a and a second distance d2 between first subunit 44 of second half 32b and second counter-electrode 52b change. By changing distances d1 and d2, the capacitances of the capacitors made out of counter-electrodes 52a and 52b and adjacent components 32a and 44 of seismic weight 32 change as well. Consequently, by evaluating the changes in the capacitances, a displacement of the seismic weight is reliably detectable/determinable, and/or the acceleration of the micromechanical component along axis 50 or an acceleration component parallel to axis 50 are easily deducible. Since methods for suitably evaluating the measured values determined at the capacitors are conventional, they are not discussed in further detail herein.

Figure 3A:
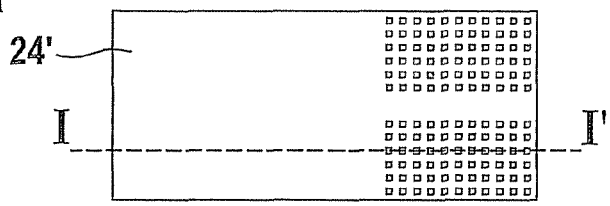
FIGS. 3Aa and 3Ba represent top views of a semiconductor substrate, and FIGS. 3Ab and 3Bb represent perpendicular cross-sections of the semiconductor substrate along a line I-I' of FIGS. 3Aa and 3Ba.
Figure 3A:
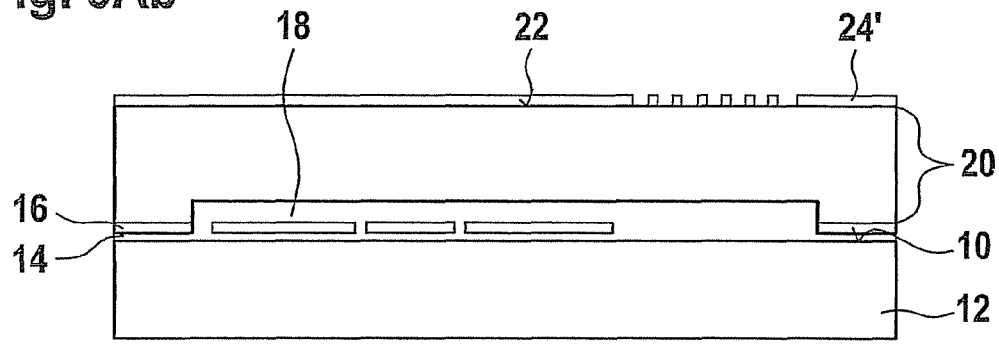

FIGS. 3Aa and 3Ba represent representing top views of a semiconductor substrate, and FIGS. 3Ab and 3Bb represent perpendicular cross-sections of the semiconductor substrate along a line I-I' of FIGS. 3Aa and 3Ba.

Figure 3B:
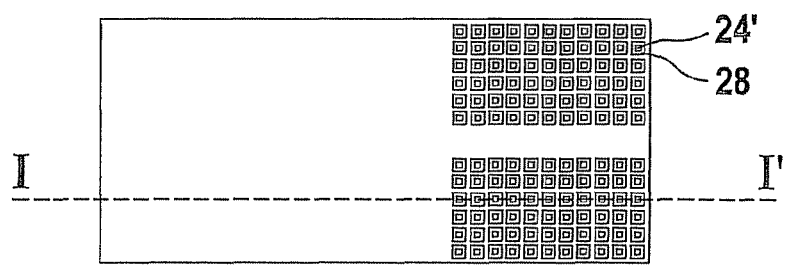
Figure 3B:
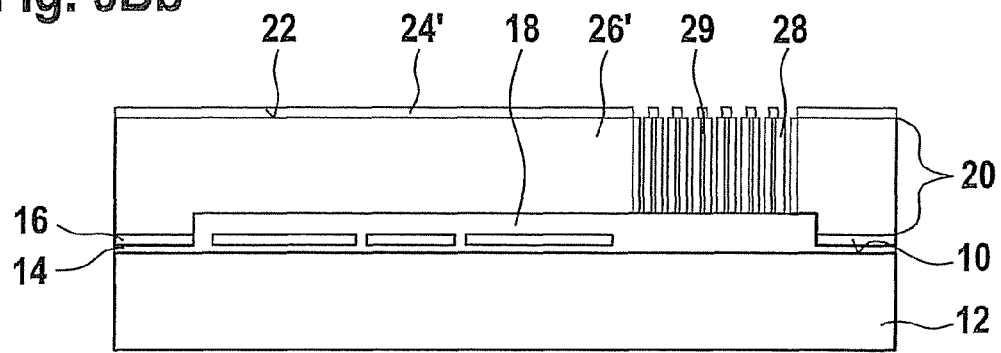

In the specific embodiment of the manufacturing method represented by FIGS. 3A and 3B, a passivation layer 24', in which holes are formed in place of rib-shaped recesses (see FIGS. 3Aa and 3Ab), is deposited onto the layer construction shown in FIGS. 1Aa and 1Ab. The above-described etching method for forming starting structure 26' is then executed.

In this etching step using passivation layer 24', more first material is exposed per unit of surface. Consequently, a larger amount of the first material is also available for a substitution process subsequently carried out, e.g., using $WF_6$ for integrating tungsten into the seismic weight. Therefore, a larger amount of second material 28 may be integrated into the seismic weight (see FIG. 3Ba and FIG. 3Bb).

Figure 4A:
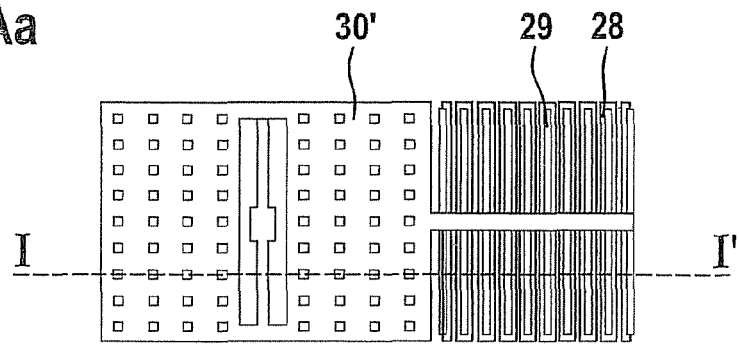
FIGS. 4Aa and 4Ba represent top views of a semiconductor substrate, and FIGS. 4Ab and 4Bb represent perpendicular cross-sections of the semiconductor substrate along a line I-I' of FIGS. 4Aa and 4Ba.
Figure 4A:
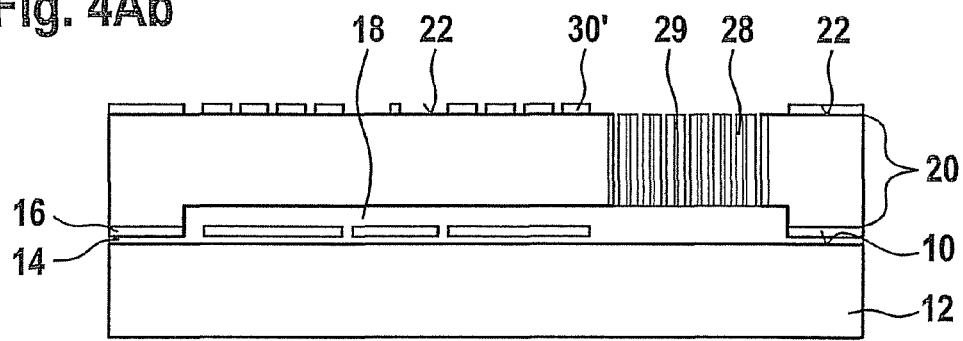

FIGS. 4Aa and 4Ba represent top views of a semiconductor substrate, and FIGS. 4Ab and 4Bb represent perpendicular cross-sections of the semiconductor substrate along a line I-I' of FIGS. 4Aa and 4Ba.

Figure 4B:
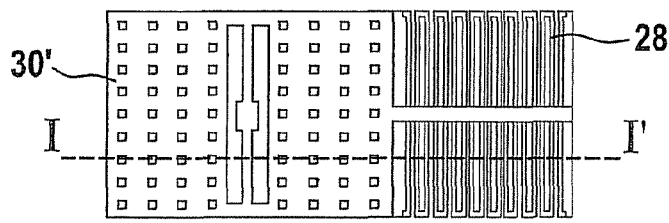
Figure 4B:
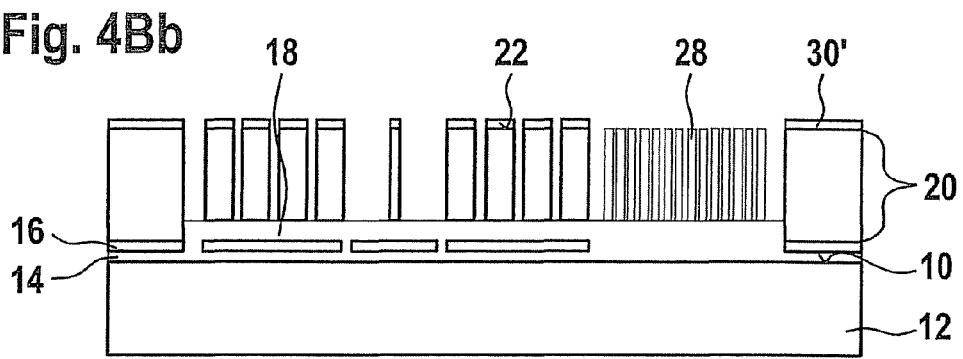

In the manufacturing method shown with the aid of FIGS. 4Aa and 4Ba, starting out from the layer construction of FIGS. 1Da and 1Db, an etching mask 30' is formed on upper side 22, in which through-recesses are formed, the through-recesses exposing the residual semiconductor regions 29 made of the first material, the residual semiconductor regions lying in the plane of upper side 22 and being at least partially surrounded by second material 28 (see FIG. 4Aa and FIG. 4Ab). These residual semiconductor regions 29 are removed in the subsequent etching step (see FIGS. 4Ba and 4Bb). Second material 28 is preferably not attacked in this etching step. In this manner, contact surfaces 56 between the first material and second material 28 of the seismic weight subsequently completed are reducible. This reduces/prevents a bimetallic effect in the finished seismic weight.

Figure 5A:
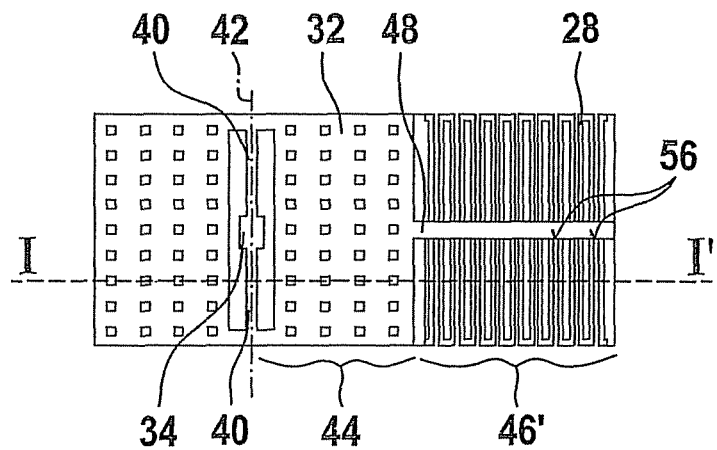
Figure 5B:
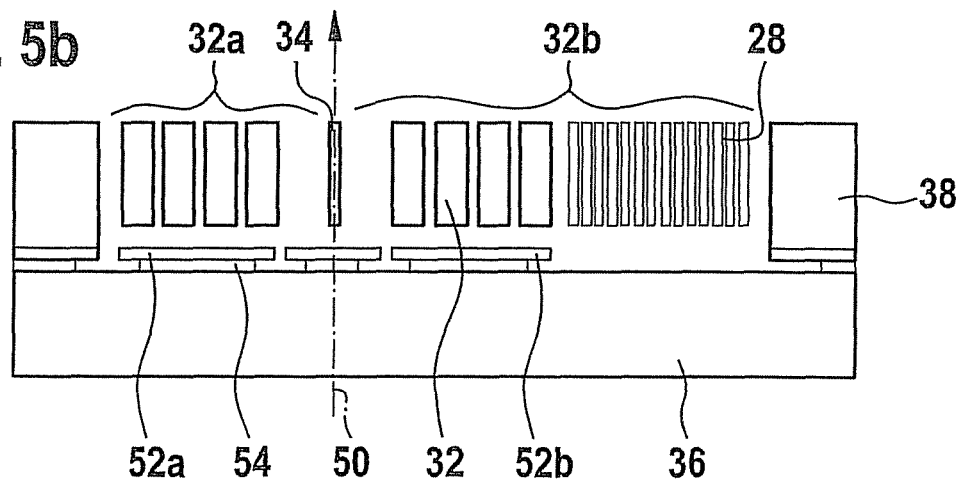

FIGS. 5a and 5b show schematic representations of a second specific embodiment of the micromechanical component, FIG. 5a representing a top view of the micromechanical component, and FIG. 5b representing a perpendicular cross section of the micromechanical component along a line I-I' of FIG. 5a.

The micromechanical component shown in FIG. 5a and FIG. 5b has the components 32 through 38, 42 through 48, 52a, 52b and 54 already described above. A repeated description of these components 32 through 38, 42 through 48, 52a, 52b and 54 is omitted. The additional weight 46' shown is made mainly out of the second material. Consequently, the total area of the contact surfaces 56 between the first material and second material 28 of additional weight 46' is comparatively small. In this manner, an occurrence of a bimetallic effect in seismic weight 32 is reliably preventable.

What is claimed is:

1. A micromechanical component, comprising:
a fixing point; and
a seismic weight surrounding the fixing point and connected to the fixing point by at least one spring, the seismic weight being made at least partially out of a first material, the first material being a semiconductor material, and being additionally made out of at least one second material, the second material having a higher density than the first material, wherein the second material and the first material are chemically bonded to one another.

2. The micromechanical component as recited in claim 1, wherein the second material includes at least one metal.

3. The micromechanical component as recited in claim 2, wherein the second material includes at least one of hafnium, tantalum, tungsten, rhenium, osmium, iridium, platinum, gold, and copper.

4. The micromechanical component as recited in claim 1, wherein the seismic weight includes at least a first partial weight made out of the first material and a second partial weight at least partially made out of the second material, and the second partial weight is connected to the first partial weight by at least one spring structure.

5. The micromechanical component as recited in claim 1, wherein the micromechanical component includes a substrate, and the seismic weight has an inner side oriented towards the substrate and an outer side oriented away from the substrate, and the seismic weight includes finger structures situated between the inner side and the outer side, the finger structures containing at least the second material, and longitudinal center axes of the finger structures being oriented parallelly to at least one of the inner side and to the outer side.

6. The micromechanical component as recited in claim 5, wherein heights of the finger structures extend from the inner side to the outer side.

7. The micromechanical component as recited in claim 5, wherein the finger structures are formed from the second material in such a manner that the first material is present in the finger structures as at most a residual element.

8. The micromechanical component as recited in claim 5, wherein a partial outer surface of the outer side is made of the first material.

\* \* \* \* \*